United States Patent
Liao et al.

(10) Patent No.: US 12,550,647 B2
(45) Date of Patent: Feb. 10, 2026

(54) ELECTRODE TUNING, DEPOSITING, AND ETCHING METHODS

(71) Applicant: Applied Materials, Inc., Santa Clara, CA (US)

(72) Inventors: Lei Liao, San Jose, CA (US); Yung-chen Lin, Gardena, CA (US); Chi-I Lang, Cupertino, CA (US); Ho-yung David Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 569 days.

(21) Appl. No.: 17/986,028

(22) Filed: Nov. 14, 2022

(65) Prior Publication Data

US 2023/0215735 A1    Jul. 6, 2023

Related U.S. Application Data (60) Provisional application No. 63/266,391, filed on Jan. 4, 2022.

(51) Int. Cl.
*H01L 21/311* (2006.01)
*H01J 37/32* (2006.01)

(52) U.S. Cl.
CPC ..... *H01L 21/31116* (2013.01); *H01J 37/3211* (2013.01); *H01J 37/32449* (2013.01); *H01J 37/32568* (2013.01); *H01J 2237/332* (2013.01)

(58) Field of Classification Search
None
See application file for complete search history.

(56) References Cited

U.S. PATENT DOCUMENTS

| 8,129,261 | B2 | 3/2012 | Porshnev et al. |
| 8,808,562 | B2 * | 8/2014 | Ohsawa ............ H01L 21/32136 438/726 |
| 2011/0139748 | A1 | 6/2011 | Donnelly et al. |
| 2017/0345619 | A1 * | 11/2017 | Ohtake ............ H01J 37/32082 |
| 2018/0226264 | A1 | 8/2018 | Takayama et al. |
| 2019/0096695 | A1 * | 3/2019 | Mehrotra .......... H01L 21/32136 |
| 2020/0251345 | A1 | 8/2020 | Yin et al. |
| 2021/0066089 | A1 | 3/2021 | Yokoyama et al. |
| 2021/0193481 | A1 | 6/2021 | Mehrotra et al. |

OTHER PUBLICATIONS

International Search Report and Written Opinion for International Application No. PCT/US2022/049610 dated Mar. 22, 2023.

* cited by examiner

*Primary Examiner* — Stephanie P Duclair
(74) *Attorney, Agent, or Firm* — Patterson + Sheridan, LLP (57) ABSTRACT

A method of forming features over a semiconductor substrate is provided. The method includes supplying a gas mixture over a surface of a substrate at a continuous flow rate. A first radio frequency (RF) signal is delivered to an electrode while the gas mixture is supplied at the continuous flow rate to deposit a polymer layer over the surface of the substrate. The surface of the substrate includes an oxide containing portion and a nitride containing portion. A second RF signal is delivered to the electrode while continuously supplying the gas mixture at the continuous flow rate to selectively etch the oxide containing portion relative to the nitride containing portion.

19 Claims, 4 Drawing Sheets

ELECTRODE TUNING, DEPOSITING, AND ETCHING METHODS

CROSS-REFERENCE TO RELATED APPLICATIONS

This application claims benefit of U.S. Provisional Patent Application No. 63/266,391, filed Jan. 4, 2022, which is herein incorporated by reference in its entirety.

BACKGROUND

Field

The embodiments herein generally relate to deposition and high selectivity etching processes that are performed using extreme ultraviolet (EUV) lithography patterned films.

Description of the Related Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing a film stack and an etch processes that are capable of reliably forming features with such high aspect ratios presents a significant challenge. However, inaccurate control or low resolution of the lithography exposure and developing process may cause in poor critical dimension of a photoresist layer utilized to transfer features in a film stack, resulting in unacceptable line width roughness (LWR). Large line width roughness (LWR) and undesired wiggling profile of the photoresist layer resulted from the lithography exposure and developing process may cause inaccurate feature transfer to the film stack, thus, eventually leading to device failure and yield loss.

Furthermore, during etching of such film stack, redeposition or build-up of by-products or other materials generated during the etching process may accumulate on the top and/or sidewalls of the features being etched, thus undesirably blocking the opening of the feature being formed in the material layer. Different materials selected for the film stack may result in different amounts or profiles of the by-products redeposited in the film stack. Furthermore, as the opening of the etched features are narrowed and/or sealed by the accumulated redeposition of material, the reactive etchants are prevented from reaching the lower surface of the features, thus limiting the aspect ratio that may be obtained. Additionally, as the redeposition material or build-up of by-products may randomly and/or irregularly adhere to the top surface and/or sidewalls of the features being etched, the resulting irregular profile and growth of the redeposition material may alter the flow path of the reactive etchants, thus resulting in bowing or twisting profiles of the features formed in the material layer. In accurate profile or structural dimensions may result in collapse of the device structure, eventually leading to device failure and low product yield. Poor etching selectivity to the materials included in the film stack may undesirably result in an inaccurate profile control, thus eventually leading to device failure. Moreover, processes having high selectivity typically produce devices at a lower throughput relative.

Therefore, there is a need in the art for a proper film stack and an etching method for etching features with desired profile and small dimensions in such film stack having high production throughput.

SUMMARY

In some embodiments, a method of forming features over a semiconductor substrate is provided. The method includes supplying a gas mixture over a surface of a substrate at a continuous flow rate. A first radio frequency (RF) signal is delivered to an electrode while the gas mixture is supplied at the continuous flow rate to deposit a polymer layer over the surface of the substrate. The surface of the substrate includes an oxide containing portion and a nitride containing portion. A second RF signal is delivered to the electrode while continuously supplying the gas mixture at the continuous flow rate to selectively etch the oxide containing portion relative to the nitride containing portion.

In some embodiments, a method of processing a semiconductor substrate is provided including positioning a substrate on a substrate support disposed in a process volume of a process chamber. The method includes flowing a halogen-containing gas into the process volume at a continuous flow rate. RF signals are cyclically delivered to a source electrode disposed over the substrate disposed on the substrate support. Cyclically delivering the RF signals includes supplying a first radio frequency (RF) signal at a first RF power to the source electrode for a first time period. The method includes reducing the first RF power supplied to the source electrode to a second RF power for a second time period.

In some embodiments, a method of processing a semiconductor substrate is provided. The method includes positioning the substrate on a substrate support disposed in a process volume of a process chamber. The method includes flowing a halogen-containing gas into the process volume at a continuous flow rate. RF signals are cyclically delivered to a source electrode disposed over the substrate. Cyclically delivering RF signals to the source electrode includes supplying a bias radio frequency (RF) power to a bias electrode coupled to the substrate support for a first time period. The method includes increasing the bias RF power to the bias electrode for a second time period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments for the present application includes methods for forming a film stack and an etching process to etch such film stack to form features having predetermined aspect ratios and profiles in the film stack. The method includes cyclically tuning one or more electrodes disposed in the process chamber to cyclically deposit and etch portions of the substrate according to a predetermined pattern. Rather than switching or providing alternating bursts of gases into the process volume to deposit and etch portions of the substrate, a continuous flow of a gas mixture is provided to the process volume and one or more electrodes are tuned to control the deposition and etching processes.

Process Chamber

Figure 1:
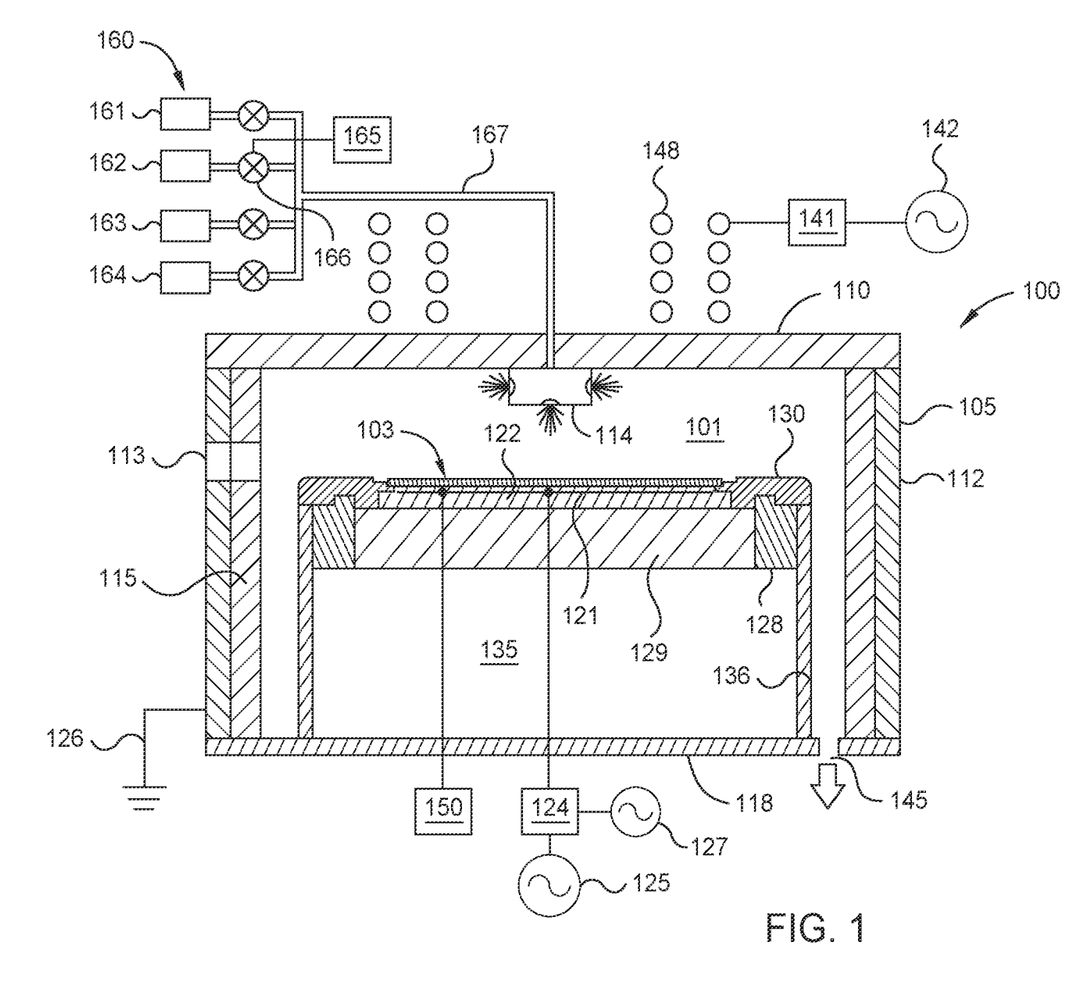
FIG. 1 depicts a process chamber that may be used to process substrates, according to some embodiments.

FIG. 1 is a sectional view of one example of a processing chamber 100 suitable for performing a patterning process to deposit and etch a film stack. Although the processing chamber 100 is shown including a plurality of features that enable etching performance, it is contemplated that other processing chambers may be adapted to benefit from one or more of the features disclosed herein.

The plasma processing chamber 100 includes a chamber body 105 having a processing volume 101 defined therein. The chamber body 105 has sidewalls 112 and a bottom 118, which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and can be proportionally larger than the size of the substrate 103 to be processed therein.

The chamber body 105 supports a lid 110 to enclose the processing volume 101. The chamber body 105 can be fabricated from aluminum or other suitable materials. A substrate access port 113 is formed through the sidewall 112 of the chamber body 105, facilitating the transfer of the substrate 103 into and out of the plasma processing chamber 100. The substrate access port 113, which selectively sealable by use of a slit valve, is typically coupled to a transfer chamber and/or other processing chambers of a substrate processing system (not shown), such as a cluster tool.

A pumping port 145 is defined in the chamber body 105 and connected to the processing volume 101. A pumping device (not shown) is coupled through the pumping port 145 to the processing volume 101 to evacuate and control the pressure of the processing volume 101. The pumping device can include one or more rough pumps, turbo pumps and throttle valves.

A gas panel 160 is coupled by a gas line 167 to the chamber body 105 to supply process gases into the processing volume 101. The gas panel 160 can include one or more process gas sources 161, 162, 163, 164 and can additionally include inert gases, non-reactive gases, and reactive gases, if desired. Examples of process gases that can be provided by the gas panel 160 include, but are not limited to, halogen-containing gases including $BCl_3$, $Cl_2$, $C_4F_6$, $C_2F_2$, HCl, HF, $F_2$, $Br_2$, HCl, HBr, $SF_6$, and $NF_3$; oxygen-containing gases including $O_2$, $H_2O$, $H_2O_2$, $O_3$, $N_2O$, and $NO_2$; hydrogen-containing gases including $H_2$; carbon-containing gases, such as hydrocarbons including methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), and isomers thereof; and inert gases including argon (Ar), and helium (He). Additionally, process gasses can include nitrogen, chlorine, fluorine, oxygen, boron, and hydrogen containing gases such as $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$ and $H_2$ among others.

Valves 166 control the flow of the process gases from the process gas sources 161, 162, 163, 164 from the gas panel 160 and are managed by a system controller 165. The flow of the gases supplied to the chamber body 105 from the gas panel 160 can include combinations of the gases.

The lid 110 can include a showerhead or a nozzle 114. The nozzle 114 has one or more ports for introducing the process gases from the process gas sources 161, 162, 164, 163 of the gas panel 160 into the processing volume 101. After the process gases are introduced into the plasma processing chamber 100, the gases are energized by use of a power source to form plasma. An antenna 148, such as one or more inductor coils, can be provided adjacent to the plasma processing chamber 100 to aid in the formation of the plasma. Although the antenna 148 is depicted as a pair of concentric, vertical coils, other coil arrangements are also contemplated such as a coil having a vertical portion, a horizontal portion, or a combination thereof. An antenna power supply 142 is used to power the antenna 148 through a match circuit 141 to inductively couple energy, such as RF energy, to the process gas to maintain a plasma formed from the process gas in the processing volume 101 of the plasma processing chamber 100. Alternatively, or in addition to the antenna power supply 142, process electrodes below the substrate 103 and/or above the substrate 103 can be used to capacitively couple RF power to the process gases to maintain the plasma within the processing volume 101. The operation of the antenna power supply 142 can be controlled by a controller, such as the system controller 165 that also controls the operation of other components in the plasma processing chamber 100. The RF source power 142 typically is capable of producing up to about 8 kilowatts (kW) at a tunable frequency in a range from about 50 kHz to about 200 MHz, such as producing between 50 W and 5000 W, such as about 500 W to about 3000 W, such as about 500 W to about 1000 W, at frequency between 1 MHz and 60 MHz, such as about 2 MHz to about 13.56 MHz.

The substrate support 135 is disposed in the processing volume 101 to support the substrate 103 during processing. The substrate support 135 can include an electrostatic chuck (ESC) 122 for holding the substrate 103 during processing. The ESC 122 uses the electrostatic attraction to hold the substrate 103 to the substrate support 135. The ESC 122 is powered by one or more RF power supplies 125, 127 integrated with a match circuit 124. In one implementation, the substrate support 135 is configured as a cathode and includes an electrode 121 that is embedded within a dielectric body and coupled to a plurality of RF power bias sources 125, 127. In some embodiments, the electrode 121 is the electrostatic chucking (ESC) electrode disposed a distance (e.g. 1 to 5 millimeters (mm)) from the substrate supporting surface of the ESC. Each of the bias sources provides a bias, which attracts plasma ions, formed by the process gases in the processing volume 101, to the ESC 122 and substrate 103 positioned thereon. The RF bias power sources 125, 127 are generally capable of producing an RF signal having a frequency of about 50 kHz to about 200 MHz and a power of about 0 watts and about 8 kW, such as about 1 watt and about 5 kW. An additional bias power source (not shown) may be coupled to the electrode 121 to control the characteristics of the plasma.

Each RF power supply 125, 127 can cycle on and off, or pulse, during processing of the substrate 103. The ESC 122 has an isolator 128 for the purpose of making the sidewall of the ESC 122 less attractive to the plasma to prolong the maintenance life cycle of the ESC 122. Additionally, the substrate support 135 can have a cathode liner 136 to protect the sidewalls of the substrate support 135 from the plasma gases and to extend the time between maintenance of the plasma processing chamber 100.

Furthermore, the electrode 121 is coupled to a power source 150. The power source 150 provides a chucking voltage of about 200 volts (V) to about 10,000 V to the electrode 121. The power source 150 can also include a system controller for controlling the operation of the electrode 121 by directing a DC current to the electrode 121 for chucking and de-chucking the substrate 202.

During operation, the substrate 103 is disposed on the substrate support 135 in the plasma processing chamber 100. A process gas and/or gas mixture is introduced into the chamber body 105 through the nozzle 114 from the gas panel 160. A vacuum pump system maintains the pressure inside the process volume 101 while removing deposition by-products.

The ESC 122 can include heaters disposed therein and connected to a power source (not shown), for heating the substrate, while a cooling base 129 supporting the ESC 122 can include conduits for circulating a heat transfer fluid to maintain a temperature of the ESC 122 and substrate 103 disposed thereon. The ESC 122 is configured to perform in the temperature range desired by the thermal budget of the device being fabricated on the substrate 103. For example, the ESC 122 can be configured to maintain the substrate 103 at a temperature of about 25 degrees Celsius to about 150 degrees Celsius, such as about 30 degrees Celsius to about 110 degrees Celsius.

A cover ring 130 is disposed on the ESC 122 and along the periphery of the substrate support 135. The cover ring 130 is configured to confine etching gases to a desired portion of the exposed top surface of the substrate 103, while shielding the top surface of the substrate support 135 from the plasma environment inside the plasma processing chamber 100.

The system controller 165 can be used to control the process sequence, regulating the gas flows from the gas panel 160 into the plasma processing chamber 100 and other process parameters. The system controller 165 includes a central processing unit (CPU), a memory, and support circuits. The system controller 165 is used to control the process sequence used to process the substrate. The CPU is a general-purpose computer processor configured for use in an industrial setting for controlling the processing chamber and sub-processors related thereto. The memory described herein, which is generally non-volatile memory, can include random access memory, read-only memory, hard disk drive, or other suitable forms of digital storage, local or remote. The support circuits are conventionally coupled to the CPU and comprises cache, clock circuits, input/output subsystems, power supplied, and the like, and combinations thereof. Software routines, when executed by the CPU, transform the CPU into a specific purpose computer (controller) that controls the plasma processing chamber 100 such that the processes are performed in accordance with the present disclosure. Software routines (programs) and data can be coded and stored within the memory for instructing the processor within the CPU. A software program (or computer instructions) readable by CPU in the system controller 165 determines which tasks are performable by the components in the processing chamber 100. The software routines can also be stored and/or executed by a second controller (not shown), such as a processing system (e.g., cluster tool) controller, that is collocated with the plasma processing chamber 100.

Substrate Processing Method

Figure 2:
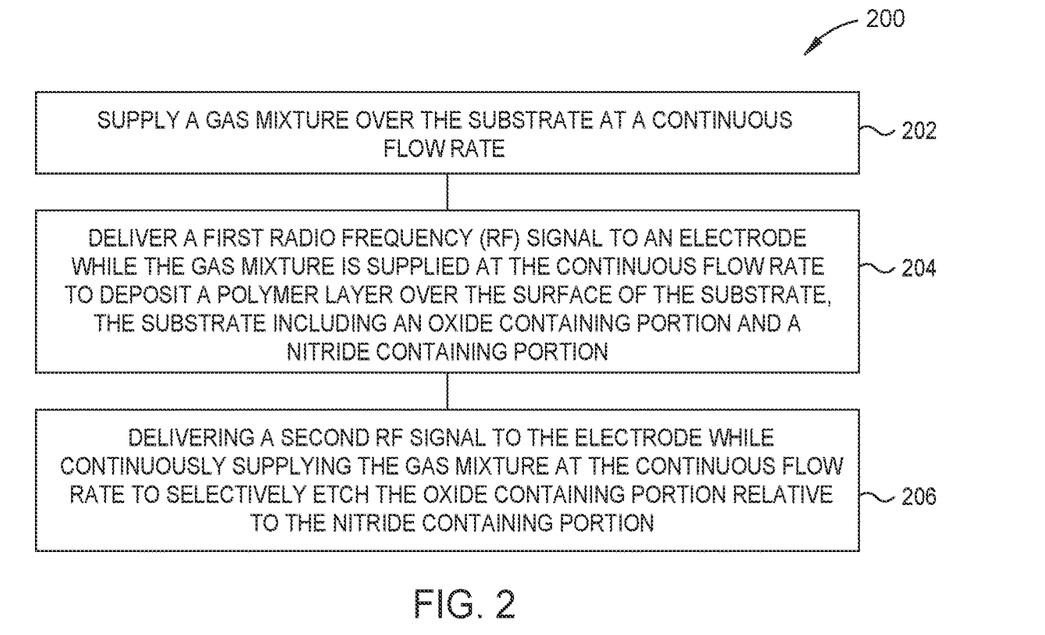
FIG. 2 depicts a flow diagram of a method of patterning a substrate, according to some embodiments.

FIG. 2 depicts a flow diagram of a method 200 of patterning a substrate, according to some embodiments. The method 200 includes an activity 202 in which a gas mixture is supplied over the substrate at a continuous flow rate. The gas mixture can be supplied from the gas panel 160 such as from one or more process gas sources 161, 162, 163, 164. The gas mixture includes a halogen-containing gas, a boron containing gas, an inert gas, or a combination thereof. In some embodiments, the gas mixture includes a chlorine-containing gas, such as boron trichloride ($BCl_3$).

The gas mixture can include a halogen-containing gas and an argon-containing gas at a volumetric ratio of about 1:1 to about 1:10, such as about 1:3 to about 1:5, or about 1:0 to about 10:1, such as about 3:1 to about 2:1. The halogen-containing gas is provided at a volumetric flow rate of about 30 sccm to about 300 sccm, such as about 100 sccm to about 200 sccm. Other flow rates are contemplated depending on the process volume size, predetermined substrate pattern, and process chamber design. The inert gas, such as argon is provided at a volumetric flow rate of about 0 sccm to about 900 sccm, such as about 30 to about 800 sccm, such as about 100 sccm to about 700 sccm, such as about 200 sccm to about 600 sccm. In some embodiments, additional gases are provided such as one or more of $O_2$, $H_2$, $C_4F_6$, $CH_2F_2$, $CF_4$, and $CHF_3$, $C_4F_8$, $C_4F_6$. The gas mixture is provided to the process volume 101 continuously without switching gas or changing gas mixture composition. The gas mixture is delivered at a process pressure of about 1 mT to about 100 mT.

The method 200 includes an activity 204 in which a first radio frequency (RF) signal is delivered to an electrode while the gas mixture is supplied at the continuous flow rate to deposit a polymer over the substrate, the substrate having an oxide containing portion and a nitride containing portion. The polymer includes $BCl_n$, $CCl_m$, $CF_m$, or combinations thereof, where n is 3 or less and m is 4 or less. In some embodiments, the oxide containing portion includes a metal oxide, a semiconductor oxide, or combinations thereof. In some embodiments, the oxide containing portion includes aluminum oxide ($Al_2O_3$), zirconium oxide ($ZrO_2$), titanium dioxide ($TiO_2$), hafnium dioxide ($HfO_2$), $HfAlO_x$, silicon oxide, germanium oxide, or combinations thereof. In some embodiments, the nitride containing portion includes silicon nitride ($SiN_x$), titanium nitride ($TiN_x$), gallium nitride (GaN), AlGaN, or combinations thereof. In some implementations, activity 202, in which the gas mixture is supplied, and activity 204, in which the polymer is deposited over the substrate, occurs at least partially simultaneously.

The first RF signal includes a first RF source power from RF source 142 of about 50 W to about 3000 W, such as about 100 W to about 1000 W, such as about 500 W to about 800 W. The source power is supplied at a RF source frequency of about 1 MHz to about 120 MHz, such as about 2 MHz to about 60 MHz, or such as about 13.56 MHz to about 40 MHz. The RF source 142 is coupled to a lid 110 of a chamber body 105, such as via antenna 148. In some embodiments, the first RF signal includes a first RF bias power of about 0 W to about 500 W, such as about 0 W to about 100 W, provided by one or more bias electrode sources 125, 127, such as less than 10 W. In some embodiments, the first RF bias electrode source 125 provides energy at a lower frequency relative to the second RF bias electrode source 127. The first and second bias electrode sources 125, 127 are each coupled to the electrode 121 within a substrate support 135, and the semiconductor substrate 103 is disposed on the substrate supporting surface of the substrate support 135 during the method 200. Each of the bias electrode sources are tuned independently relative to one another and to the source electrode 142. The first bias electrode source has a frequency of about 2 MHz or less, such as 1 MHz, and the second bias electrode source has a frequency of greater than 2 MHz, such as about 13.56 MHz.

The method 200 includes activity 206 in which a second RF signal is delivered to the electrode while continuously supplying the gas mixture at the continuous flow rate to selectively etch the oxide containing portion relative to the nitride containing portion. The etching has a selectivity to the oxide containing portion relative to the nitride containing portion of about 5 or greater, such as about 10 to about 50, such as about 20 to about 40. In some embodiments, an oxide etch rate is about 0.05 nm/s to about 1 nm/s for the oxide-containing portion. In some embodiments, the nitride etch rate is about 0 nm/s to about 0.02 nm/s for the nitride-containing portion. The second RF signal includes a second RF source power less than the first RF source power. In some embodiments, the RF power provided to the source electrode 142 is reduced during activity 206. In some embodiments, the RF power provided to the source electrode 142 is turned off during activity 206. In some alternate embodiments, the second RF signal includes delivering a second RF bias power greater than the first RF bias power. In some embodiments, one or more of the RF bias electrode sources are increased in power or turned on during activity 206.

Activity 204 and activity 206 are repeated cyclically. In some embodiments, a duty cycle for the sequence of activity 204 (e.g., first RF signal) relative to activity 206 (e.g., second RF signal) is about 5% to about 95%, such as about 30% to about 60%, such as about 40% to about 50%. In one example, activity 204 and activity 206 makes up a cycle having a frequency of about 10 Hz to about 4000 Hz. In some embodiments, the pressure of the process volume is maintained at about 1 to about 100 mTorr during method 200.

Figure 3:
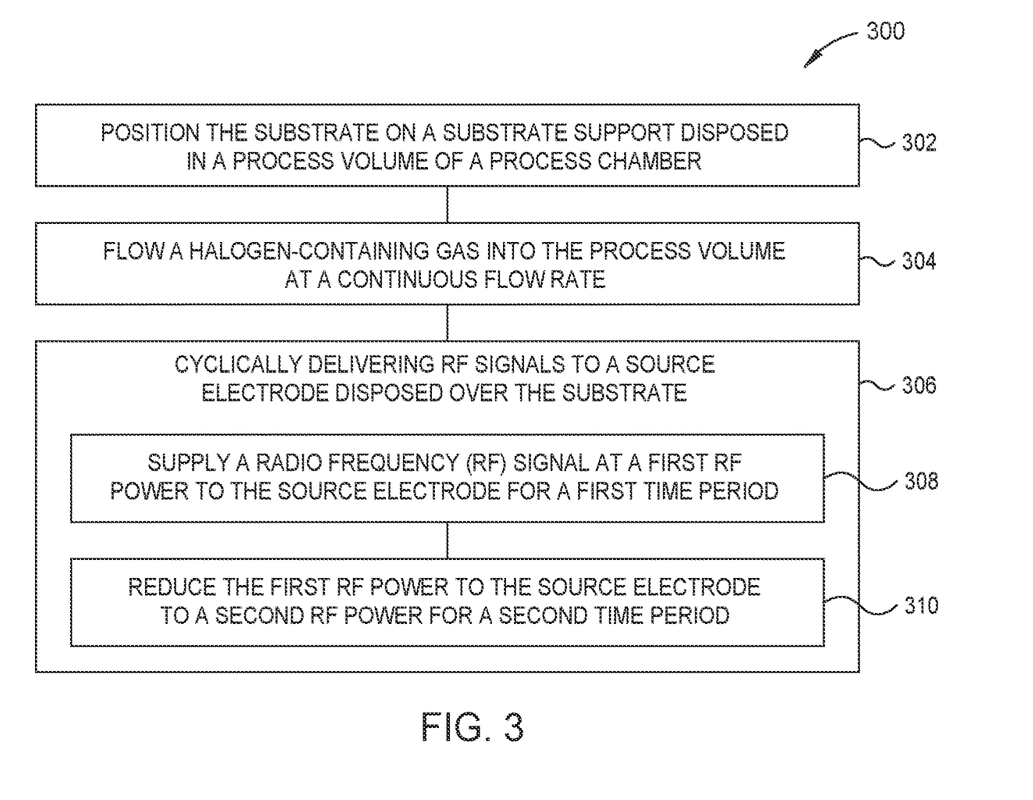
FIG. 3 depicts a flow diagram of a method of tuning RF power to one or more electrodes, according to some embodiments.

FIG. 3 depicts a flow diagram of a method 300 of tuning RF power to one or more electrodes, according to some embodiments. The method 300 includes activity 302 in which a substrate is positioned on a substrate support disposed in a process volume of a process chamber, activity 304 in which a halogen-containing gas is delivered into the process volume at a continuous flow rate, and activity 306 in which RF signals are cyclically delivered to a source electrode disposed over the substrate. Cyclically delivering RF signals includes activity 308 in which a radio frequency signal is supplied to the source electrode (e.g., electrode 121) for a first time period, and an activity 310 in which the RF power to the source electrode is reduced and applied for a second time period.

Figure 4:
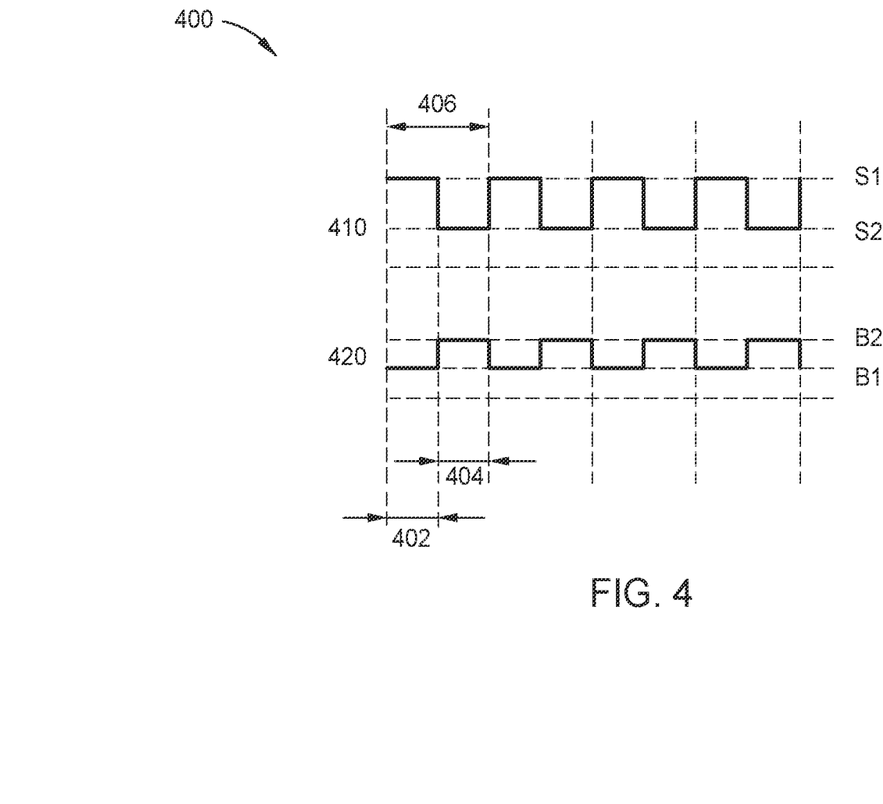
FIG. 4 depicts a graphical representation of radio frequency power signals, according to some embodiments.

FIG. 4 depicts a graphical representation 400 of radio frequency power signals, according to some embodiments. Referring back to FIG. 2 and FIG. 3, period 402 represents a first RF signal for depositing a polymer over a substrate as described in relation to activity 204 in method 200, and/or a supplying an RF signal to an electrode described in relation to activity 308 in method 300. Period 404 represents a second RF signal for selectively etching described in relation to activity 206 in method 200, and/or reducing the first RF power to the electrode described relation to activity 310 in method 300. Together periods 402 and 404 make up a duty cycle 406. Curve 410 depicts a source RF signal, which has a first source RF signal S1 state and a second source RF signal S2 state, that is delivered to the source electrode (e.g., source electrode 142). Curve 420 depicts an RF signal, which has a first bias RF signal B1 state and a second bias RF signal B2 state, that is delivered to one or more bias electrodes (e.g., electrode 121). The delivery of power provided in each of the RF signals to the various electrodes occurs while continuously flowing the same gas mixture into the process chamber. As illustrated in FIG. 4, the high and low RF power states of the source RF signal provided to the source electrode(s) are switched relative to the high and low RF power states of the bias RF signals provided to the one or more bias electrodes within each period of a duty cycle. In one example, the switched states of the RF signals that occur during the periods 402 start with a reduction of power provided to the source electrode at the start of the second source RF signal S2 state, which occurs substantially simultaneously with an increase of power provided to the one or more bias electrodes due to the formation of the second source RF signal B2 state, and vice versa during the period 404. In some embodiments, RF signal B1 state can include a power level of 40 W or less, such as 10 W or less, such as 0 to 5 W, or even between 0.1 and 5 W, and RF signal B2 state can include a power level of about 10 W to about 500 W, such as about 40 W to about 100 W. In some embodiments, RF signal S1 state includes a power level of about 100 W or greater, such as about 1,000 W to about 3,000 W, and RF signal S2 state includes a power level of 500 W to about 2000 W.

In some embodiments, the power delivered during activity 204 (e.g., during period 402) and the power delivered during activity 206 (e.g., during period 404) are alternately applied by the first and second bias electrode sources 125, 127, such that a first bias electrode receives a lower power level (e.g., RF signal B1 state) during period 402 and the first bias electrode (e.g., RF signal B2 state) receives a greater power level during period 404.

In some embodiments, the first bias electrode source 125 can form a RF signal at the RF signal B1 state on a first bias electrode disposed in the ESC 122 in activity 204, and the second bias electrode source 127 can form an RF signal at the RF signal B1 state on the first bias electrode disposed in the ESC 122, during activity 204. At activity 206, the second bias electrode source 127 can deliver an RF signal at the RF signal B2 state to the first bias electrode in the ESC 122 and the first bias electrode source 125 can deliver an RF signal at the RF signal B2 state to the first bias electrode. During activity 204 and/or activity 206, the RF signals provided by the first bias electrode source 125 and the second bias electrode source 127 can be different, such as the RF signals being provided at a different frequency, phase, voltage and/or power.

In another embodiment, the power delivered during activity 204 (e.g., during period 402) and the power delivered during activity 206 (e.g., during period 404) are alternately applied by the first and second bias electrode sources 125, 127 to a first bias electrode and second bias electrode. By way of example, the first bias electrode source 125 can form a first RF signal at the RF signal B1 state on a first bias electrode disposed in the ESC 122 in activity 204, and the second bias electrode source 127 can form an RF signal at the RF signal B2 state on a second bias electrode disposed in the ESC 122, during activity 204. In one configuration, the first bias electrode and the second bias electrode are adjacently positioned electrodes within the ESC 122. At activity 206, the second bias electrode source 127 can deliver an RF signal at the RF signal B1 state to a second bias electrode in the ESC 122 and the first bias electrode source 125 can deliver an RF signal at the RF signal B2 state.

In some embodiments of the method 200, after performing activity 204, at activity 206, the first bias electrode source 125 can continue to deliver the RF signal B1 state to the first bias electrode simultaneously with the second bias electrode source 127 switching from the RF signal B1 state to the RF signal B2 state. In yet another implementation, both the first and second bias electrode sources can be synchronized such that both electrode sources each sequentially deliver pulses of bias power that separately alternate between the RF signal B1 state and the RF signal B2 state to the bias electrodes. For example, the power provided to the bias electrodes are both in a first state (e.g., lower power state), or a switched off state, at activity 204 and both are in a second power state (e.g., increased power state), or at least a switched on state, at activity 206. In some embodiments, the first and second bias electrodes can be the same bias electrode or, as noted above, can be separate and distinct bias electrodes disposed in the substrate support. In some embodiments, the first electrode source 125 delivers a lower frequency power relative to a higher frequency power provided by the second electrode source 127.

Conventional processes utilize pulsed alternating deposition and etching gas compositions which is a time consuming process, due to the need to evacuate the process volume 101 before the injection of alternate gas composition, which leads to a relatively low throughput. Moreover, in conventional processing schemes, process gases are often wasted when they are not being delivered to the process volume 101, due to the need to divert the gases to vacuum pump forelines when they are not being delivered to the process volume 101 to prevent gas bursts from occurring at a later time when the flow of gases are being reintroduced into the process volume 101. Moreover, time is needed between switching gases and purging to stabilize the process conditions. Without being bound by theory, it is believed that conventional cyclic processes that include a delivery of a first gas that is adsorbed on the surface of the substrate, a second gas is then provided to activate the first gas containing surface such that the adsorbed molecules react with the substrate and results in an undesirable etching of a thin layer of the surface on which the adsorbed molecule are disposed.

The one or more processes described herein, does not alternate the delivery of gases, and instead switches between source power and bias power to control deposition and etching of material on the substrate. The resulting process surprisingly provides a selectivity of etching oxide portions of the substrate relative to nitride portions of the substrate. The selectivity is greater than 15, such as greater than 30. Without being bound by theory, it is believed that tuning the source and bias electrodes relative to one another enables depositing a thicker polymer over the nitride containing portion relative to the oxide containing portion. In some embodiments, each duty cycle deposition period 402 deposits at a cycle rate of about 0.2 nm/s to about 2 nm/s over the nitride containing portion, such as about 0.4 nm/s to about 1.5 nm/s, such as about 0.5 nm/s to about 1 nm/s. In some embodiments, each duty cycle deposition period 402 deposits less polymer on the oxide containing portion relative to the nitride containing portion, such as substantially no deposition on the oxide containing portion. During an etching period 404, the bias electrode power is increased which increases reactivity of the gas mixture to promote etching. The thicker polymer over the nitride portion protects the nitride portion and promotes higher selectivity for etching of the oxide portion during the etching 404. Without being bound by theory, the argon in the gas mixture initiates the etch reaction by bombardment and also aids with dissociation of $BCl_3$ which increases radical concentration for etching.

Figure 5:
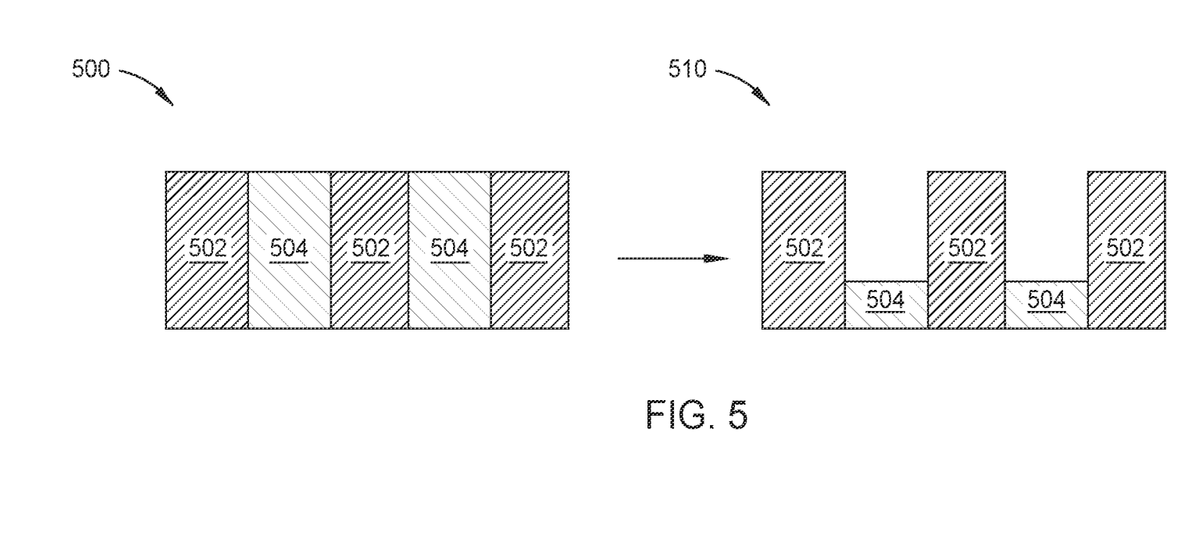
FIG. 5 depicts a substrate before and after processing the substrate using methods described herein, according to some embodiments.

FIG. 5 depicts a substrate before (e.g., 500) and after (e.g., 510) processing the substrate using methods described herein, according to some embodiments. The substrate 500 includes a nitride portion 502 and an oxide portion 504. Any patterned oxide layer relative to a nitride layer can benefit from the methods provided herein. As can be seen, after the processing substrate 500 using the methods described herein, the resulting substrate 510 is etched more in the oxide portion 504 relative to the nitride portion 502. The profile of the nitride portion 502 is retained in the resulting substrate 510.

Implementations can include one or more of the following potential advantages. One or more implementations of the disclosure advantageously enables a process having high selectivity of oxide over nitride portions of a substrate during processing while increasing substrate throughput and reducing process gas consumption.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

The terms "selectively etching" or "selectively removing" are intended to broadly describe a process where one type of material is preferentially removed relative to another type of material, or a process of selectively removing material in one region of a substrate relative to another region of the substrate.

While the foregoing is directed to embodiments of the present disclosure, other and further implementations of the disclosure may be devised without departing from the basic scope thereof, and the scope thereof is determined by the claims that follow.

What is claimed is:

1. A method of forming features over a semiconductor substrate, comprising:
   supplying a gas mixture over a surface of a substrate at a continuous flow rate;
   delivering a first radio frequency (RF) signal to an electrode while the gas mixture is supplied at the continuous flow rate to deposit a polymer layer over the surface of the substrate, wherein the surface of the substrate comprises an oxide containing portion and a nitride containing portion; and
   delivering a second RF signal to the electrode while continuously supplying the gas mixture at the continuous flow rate to selectively etch the oxide containing portion relative to the nitride containing portion, wherein the first RF signal is at a high power state when the second RF signal is at a low power state and the first RF signal is at a low power state when the second RF signal is at a high power state.

2. The method of claim 1, wherein the first RF signal comprises a first RF source power of about 500 W to about 3000 W, and the second RF signal comprises a second RF source power less than the first RF source power.

3. The method of claim 2, wherein the electrode is a lid of a process chamber that is disposed over the substrate.

4. The method of claim 1, wherein the first RF signal comprises a first RF bias power of about 0 W to about 500 W, and the second RF signal comprises a second RF bias power greater than the first RF bias power.

5. The method of claim 4, wherein the electrode is an electrode disposed within a substrate support on which the substrate is disposed while continuously supplying the gas mixture.

6. The method of claim 4, further comprising delivering a third and a fourth RF signal that comprises a third and a fourth RF bias power, respectively, that is supplied to a bias electrode.

7. The method of claim 6, wherein the first and the second RF signals comprise a first frequency and the third and fourth RF signals comprise a second frequency.

8. The method of claim 7, wherein the first frequency is about 2 MHz to about 40 MHZ, and the second frequency is about 10 MHz to about 100 MHz.

9. The method of claim 1, wherein the first RF signal comprises a first RF source frequency of about 1 MHz to about 40 MHZ, and the second RF signal comprises a second RF frequency of about 1 MHz to about 40 MHz.

10. The method of claim 1, wherein a duty cycle of delivering the first RF signal relative to delivering the second RF signal is between about 40% and about 60%.

11. The method of claim 1, wherein the gas mixture comprises a chlorine-containing gas and a boron-containing gas.

12. The method of claim 1, wherein the oxide containing portion comprises a metal oxide.

13. The method of claim 1, wherein the gas mixture comprises a chlorine-containing gas and an argon-containing gas at a volumetric ratio of about 1:1 to about 1:10.

14. The method of claim 13, wherein the gas mixture comprises:
   $BCl_3$ supplied at a gas flow rate of about 30 sccm to about 300 sccm; and
   argon supplied at a gas flow rate of about 900 sccm or less.

15. A method of processing a semiconductor substrate, comprising:
   positioning a substrate on a substrate support disposed in a process volume of a process chamber;
   flowing a chlorine-containing gas into the process volume at a continuous flow rate; and
   cyclically delivering RF signals to a source electrode disposed over the substrate disposed on the substrate support, wherein cyclically delivering the RF signals comprises:
      supplying a first radio frequency (RF) signal at a first RF power to the source electrode for a first time period; and
      reducing the first RF power supplied to the source electrode to a second RF power for a second time period;
      delivering a bias power to a bias electrode coupled to the substrate support, wherein delivering the bias power is performed substantially simultaneous with reducing the first RF power to the second RF power, wherein the first RF signal is at a high power state when the bias power is at a low power state and the first RF signal is at a low power state when the bias power is at a high power state.

16. The method of claim 15, wherein the chlorine-containing gas is flowed into the process volume at the continuous flow rate while cyclically delivering RF signals to the source electrode.

17. The method of claim 15, wherein supplying the first RF signal to the source electrode is configured to form a polymer layer over a substrate, wherein the polymer layer is formed selectively over a nitride portion of the substrate.

18. The method of claim 15, wherein reducing the first RF power to the second RF power and delivering the bias power to the bias electrode selectively etches an oxide portion relative to a nitride portion disposed on a surface of the substrate.

19. A method of processing a semiconductor substrate, comprising:
- positioning the substrate on a substrate support disposed in a process volume of a process chamber;
- flowing a chlorine-containing gas into the process volume at a continuous flow rate; and
- cyclically delivering radio frequency (RF) signals to a source electrode disposed over the substrate support,
- supplying a bias RF power to a bias electrode coupled to the substrate support for a first time period; and
- increasing the bias RF power to the bias electrode for a second time period, wherein the RF signals are at a high power state and the bias RF power is at a low power state during the first time period and the RF signals are at a low power state the bias RE power is at a high power state during the second time period.

* * * * *